United States Patent [19]
Fan et al.

[11] Patent Number: 5,890,597
[45] Date of Patent: Apr. 6, 1999

[54] WAFER RETAINING MECHANISM

[75] Inventors: Horng-Kuang Fan; Gwo-Jou Huang, both of Hsinchu; Jyh-Jone Lee, Hsin-Chu Hsien, all of Taiwan

[73] Assignee: Industrial Technology Research Institute, Hsinchu, Taiwan

[21] Appl. No.: 994,982

[22] Filed: Dec. 19, 1997

[51] Int. Cl.$^6$ ................................................ B65D 85/48

[52] U.S. Cl. ........................................... 206/710; 206/454

[58] Field of Search ..................... 206/710, 711, 206/722, 723, 454, 832; 211/41.18; 414/217

[56] References Cited

U.S. PATENT DOCUMENTS

| | | | |
|---|---|---|---|
| 4,739,882 | 4/1988 | Parikh et al. | 206/454 |
| 4,815,912 | 3/1989 | Maney et al. | 414/217 |
| 5,452,795 | 9/1995 | Gallagher et al. | 206/711 |
| 5,740,845 | 3/1998 | Bonora et al. | 206/710 |

*Primary Examiner*—Paul T. Sewell
*Assistant Examiner*—Luan K. Bui
*Attorney, Agent, or Firm*—Dougherty & Troxell

[57] ABSTRACT

Disclosed is a wafer retaining mechanism comprising a box, and more than one link unit affixed to appropriate locations of the box, the link units being operative in coordination with a wafer cassette and a chassis for retaining securely the wafers received within the cassette. The links each comprises a sliding link, a lower link, a front link, an upper link, and associated pins.

15 Claims, 3 Drawing Sheets

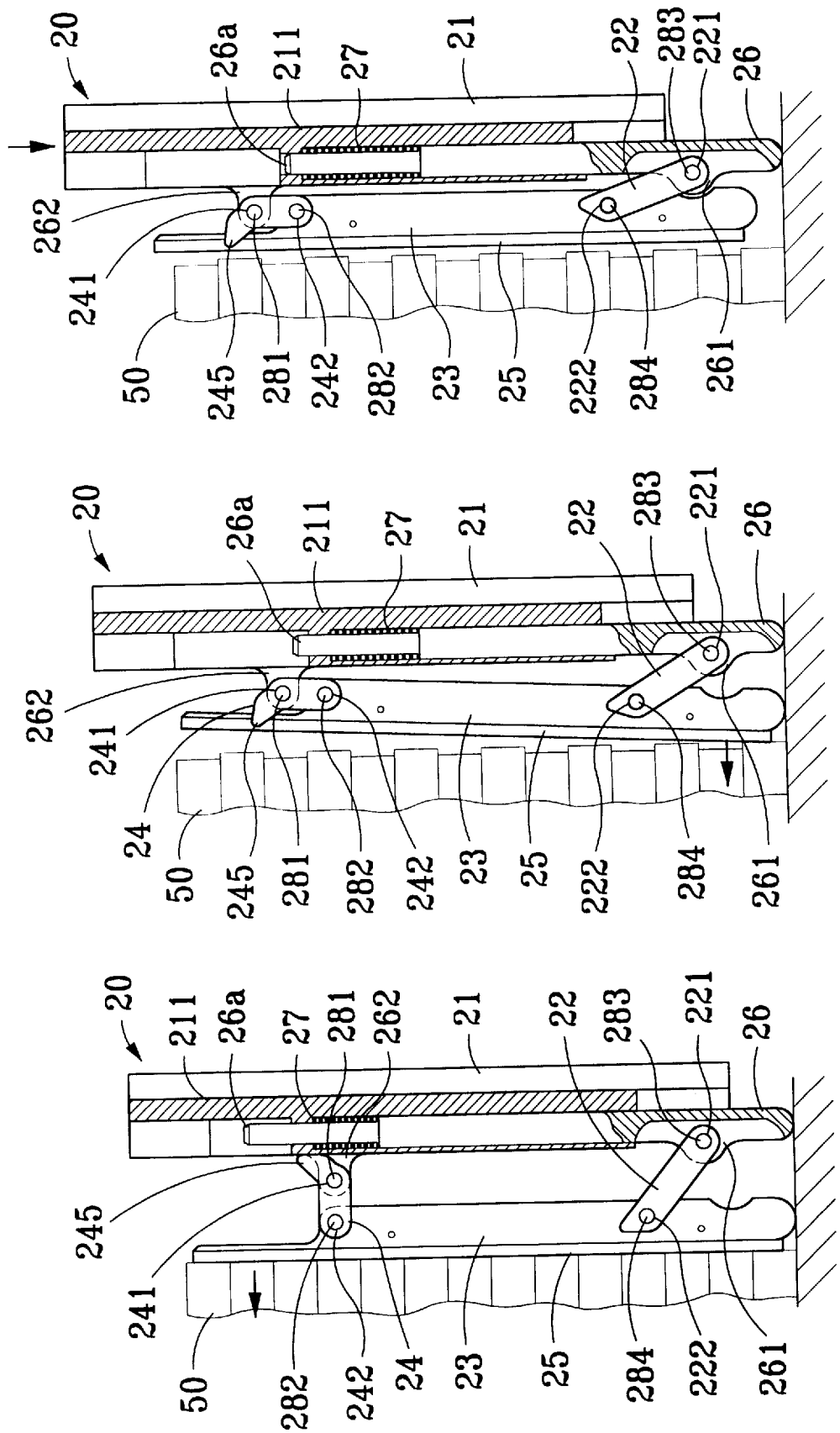

WAFER RETAINING MECHANISM

BACKGROUND OF THE INVENTION

1. Field of the Invention

The present invention relates to a wafer retaining mechanism, in particular to one including more than one link unit each of which has a sliding link, a lower link, a front link, an upper link, and associated pins, thereby the link units can urge, and retain securely, the wafers contained in a wafer cassette.

2. Description of the Prior Art

Conventionally various devices are provided for preventing the semiconductor wafers from being jarred or bumped when the wafers are transported or stored. Especially, particulate release may be caused when jarring occurs resulting in abrasion between the wafers and the contacted surfaces of a wafer cassette. To prevent wafer damage and particulate release, the wafers must be held securely within the wafer cassette.

U.S. Pat. No. 5,452,795 issued to Gallagher et al. relates to an actuated rotary retainer for silicone wafer box. The rotary retainer is attached to the sidewall of a box to prevent movement of the wafers within a wafer cassette during transportation and storage. The rotary retainer consists of an elongated shaft, fingers, a coil spring, a first bearing, and a second bearing. The first and second bearings are attached to the box, and the elongated shaft is rotably coupled to the bores of the first and second bearings. The shaft is coupled to the first and second bearings, wherein the shaft bottom contacts a door as the box and the door are engaged. The shaft rotates through the bore from a first position to a second position when the box and the door are engaged. The first and second bearings are attached to the box inner sidewall, whereby a peg of the shaft first comes into slight contact with the bottom and of a sloped rotation member when the box and door are fully engaged. The fingers retain the semiconductor wafers within the semiconductor wafer cassette when the box is engaged with the door. The wafer retaining fingers are positioned on the shaft, whereby, when the box and door are engaged, the fingers align with wafers stored in individual slots of the wafer cassette. The wafer retaining fingers absorb force from the wafers when the box is jarred during transportation.

Further, U.S. Pat. No. 4,815,912 issued to Maney et al. relates to a box door actuated retainer comprising a tongue, a box door member which extends along with the length of the tongue, a first parallelogram arm attached to the door member, two side arms attached to a box at two display locations which form a second parallelogram arm. The first and second arms are the same length as are the side arms. The side arms are pivotively connected to the first and second arms. When the box door is opened and lowered, the box door member is also lowered by the operation of gravity, causing the side arms to pivot. The pivoting of the side arms causes the tongue to travel not only downward, but also retracting away from the wafers contained in a cassette. As such, the cassette and the wafers are enabled to be easily withdrawn out of the box. When the cassette and the wafers are to be returned back into the box, the box door contacts the bottom of the box door member (though until the box door contacts the bottom position of the box door member, the retainer remains away from the wafers), the tongue moves toward and abutting upon the wafers contained in the cassette. Therefore, even if the box may be jarred or bumped, the wafers are restrained from any substantial movement. This restraint tends to reduce the movement of contamination particles.

The present invention is intended to provide a wafer retaining mechanism having a structure quite different from that disclosed in the '795 patent, while somewhat similar to that disclosed in the '912 patent in the sense that a linkage is used, the present invention serves to improve the effect in retaining the wafers contained in a cassette.

SUMMARY OF THE INVENTION

It is thus a primary object of the present invention to provide a wafer retaining mechanism being provided with more than one link unit at appropriate locations inside and of a box, thereby the link unit retains the wafers when the box receives the wafer cassette and contacts a chassis attached to the bottom of the wafer cassette.

It is still an object of the present invention to provide a wafer retaining mechanism in which two link units are respectively disposed at two neighboring corners inside and of the box, thereby the wafers contained in the cassette are retained in a more stable condition.

It is a further object of the present invention to provide a wafer retaining mechanism including an urging plate mounted on an upper link of the link unit so as to produce a solid retaining effect against the wafers.

Generally speaking, the wafer retaining mechanism of the present invention comprises a box and more than one link unit disposed at appropriate locations inside and of the box. The link unit is operative in coordination with a wafer cassette, wafers received within the wafer cassette, and a chassis attached to the bottom of the wafer cassette, such that the link unit may urge the wafers in place when the box receives the wafer cassette. The link unit includes a sliding link, a lower link, a front link, and an upper link.

BRIEF DESCRIPTION OF THE DRAWINGS

The structure and functions of the present invention are described in conjunction with the following drawings.

FIGS. 3A–3C are schematic views illustrating operation of the link units of the present invention.

DETAILED DESCRIPTION OF THE PREFERRED EMBODIMENT

Figure 1:
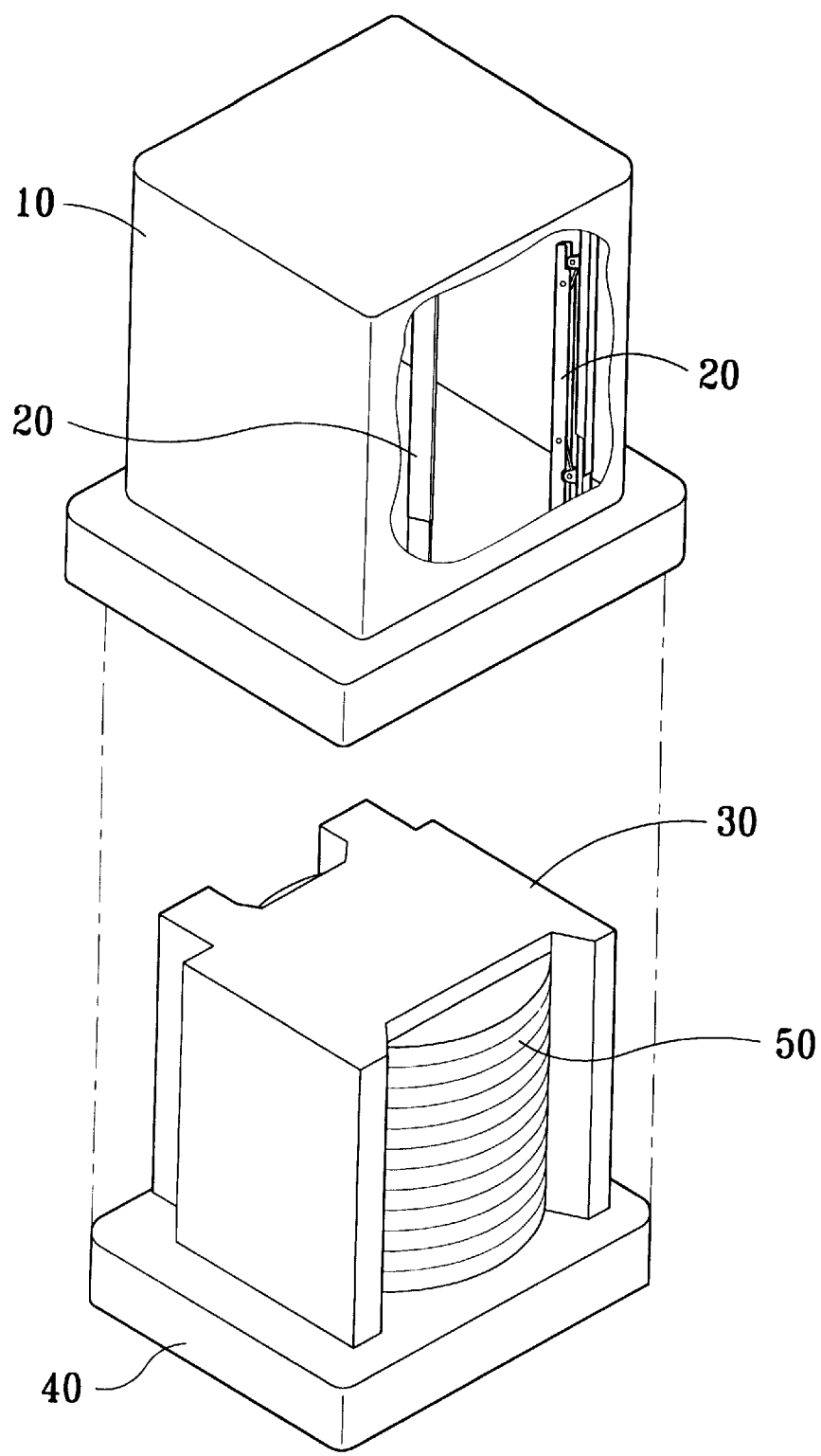
FIG. 1 is an exploded view illustrating a wafer retaining mechanism according to the present invention being assembled inside a box, with a wafer cassette, wafers, and a chassis.
Figure 2:
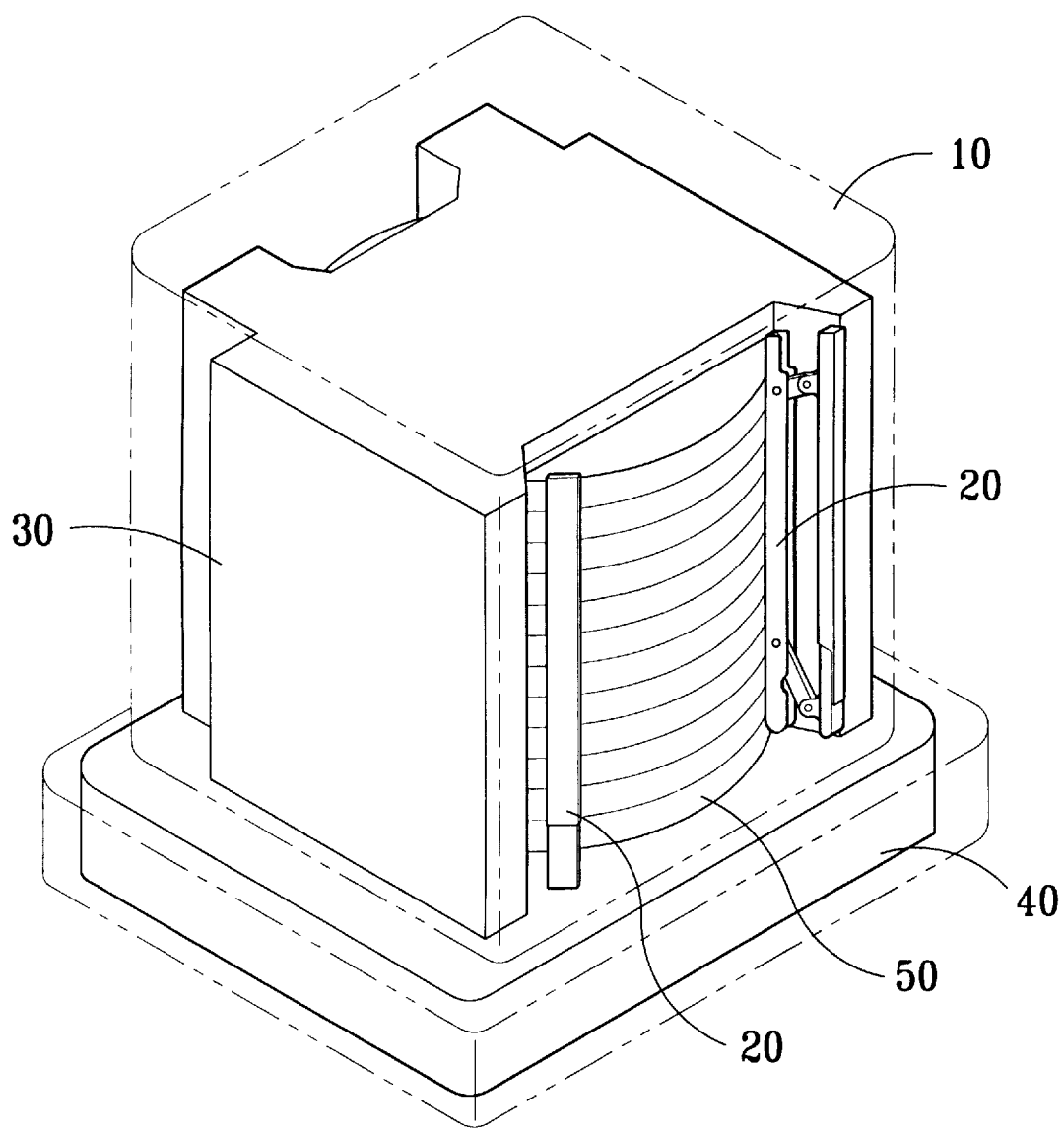
FIG. 2 is a schematic view illustrating the box receiving a wafer cassette, wherein the link units of the present invention urge against the chassis for pushing the wafers to align in place.

Now referring to FIGS. 1 and 2, a wafer retaining mechanism of the present invention comprises a box 10 and a plurality of link units 20, wherein the box 10 is a hollow body formed with an opening at lower side thereof to receive a wafer cassette 30 for storing a plurality of wafers and the wafer cassette is affixed with a chassis 40 at the bottom thereof. The link units 20 are disposed at appropriate locations inside and of the box 10. In this embodiment, two link units 20 are respectively disposed at two neighboring corners inside and of the box 10.

As shown in FIGS. 3A to 3C, the link unit 20 includes a sliding link 26, a lower link 22, a front link 23, and an upper link 24; wherein the sliding link 26 is slidably, telescopically provided on a base link 21 affixed to the box 10, the left lower side of the sliding link 26, and the left upper side of the base link 21, being respectively provided with tongues 262, 261 projecting outwards. The tongues 262 and 261 are each formed with openings for respectively pivoting the upper link 24 and the lower link 22 at the right sides thereof, by means of pins 281 and 283. The upper link 24 and the lower link 22 are pivotally connected with the front link 23 by means of pins 282 and 284, wherein the upper link 24 is formed with openings 241 and 242 at the pivots and the lower link 22 is formed with openings 221 and 222 at the pivots. Alternatively, the upper link 24 can be at the right side pivotally connected to the box 10, and the lower link 22 at the right side to the sliding link 26. Tongues 262 and 261 may be provided on the box 10, and on the sliding link 26, for pivotally connecting the upper and the lower links 24 and 22.

In this embodiment, the sliding link 26 is slidably received within the base link 21, which is affixed inside the box 10. In practice, the sliding rod 26 may be movably disposed inside the box 10 by any measures. In this embodiment, the upper end 26a of the sliding link 26 has a smaller diameter for receiving a spring 27, which urges against a limit portion 211 of the base link 21. Therefore, the spring 27 constantly applies forces to the sliding rod 26 to urge the sliding link 26 downwards subjecting the entire link unit to assume a retracted position.

When the box 10 covers the wafer cassette 30, the sliding link 26 of the link unit 20 undertakes contact with the chassis 40 (as shown in FIG. 3A). The sliding link 26 is then forced to move upwards subjecting the lower link 22 to move obliquely leftwards and upwards thereby causing the lower end of the front link 23 to move obliquely leftwards and upwards (as shown in FIG. 3B). When both the sliding link 26 and the lower link 22 urge against the chassis 40, the upper end of the front link 23 pivots about the upper link 24 to assume a fully expanded position so as to retain the wafers securely in the wafer cassette 30.

Furthermore, the front link 23 may be equipped with a disposable liner 25 at a front thereof so as to facilitate replacement of contaminated liners resulting from multiple contacts with the wafers to constantly maintain an uncontaminated contact. The upper link 24 may further be mounted with an urging plate 245 undertaking an appropriate angle for pressing against the base link 21 when the front link 23 is fully expanded so as to facilitate the front link 23 urging against the wafers 50.

It should be noted that the aforementioned embodiment is not intended to limit the scope of the present invention. Various changes and implementations with respect to the present invention may be achieved without departing the spirit of the present invention. The scope of the present invention is defined in the appended claims.

What is claimed is:

1. A wafer retaining mechanism, comprising:

a hollow box opening at a lower end for receiving a wafer cassette for storing a plurality of wafers thereon, said wafer cassette having a chassis at a bottom of the cassette; and a plurality of link units being disposed inside of said hollow box, each of said link units comprising: a sliding link, a lower link, a front link, an upper link, wherein said sliding link is slidably mounted on said box; said upper link is pivotally connected to said box and to said front link; said lower link is pivotally connected to said sliding link and said front link; whereby said front link is activated between expanded and retracted positions by movement of said sliding link relative to said hollow box, whereby when said box receives said wafer cassette, said sliding link presses against and is moved by said chassis, such movement thereby causing said front link to move toward said expanded position into contact with said plurality of wafers for securely retaining said wafers within said wafer cassette.

2. The retaining mechanism according to claim 1, wherein said hollow box has a plurality of corners and wherein said plurality of link units comprises two link units, one link unit located in each of two adjacent corners of the hollow box.

3. The retaining mechanism according to claim 1, further comprising a plurality of base links, each base link affixed to said box, each base link slidably receiving one of said sliding links.

4. The retaining mechanism according to claim 2, further comprising two base links, each base link affixed to said hollow box at one of two adjacent corners inside of the hollow box each base link slidably receiving one of said sliding links.

5. The retaining mechanism according to claim 3, wherein each of said base links has a limit portion and said sliding link has an upper end with a reduced diameter, and further comprising a spring mounted around the reduced diameter upper end and pressing against said limit portion to generate a pushing force against said sliding link, to thereby bias the front link toward the retracted position.

6. The retaining mechanism according to claim 4, wherein each of said base links has a limit portion and said sliding link has an upper end with a reduced diameter, and further comprising a spring mounted around the reduced diameter upper end and pressing against said limit portion to generate a pushing force against said sliding link to thereby bias the front link toward the retracted position.

7. The retaining mechanism according to claim 1, wherein said upper link further comprises an urging plate located so as to press against said box when said front link is in the expanded position.

8. The retaining mechanism according to claim 3, wherein said upper link further comprises an urging plate located so as to press against said base link when said front link is in the expanded position.

9. The retaining mechanism according to claim 1, further comprising a first tongue extending from said box and pivotally connected to said upper link; and a second tongue extending from said sliding link and pivotally connected to said lower link.

10. The retaining mechanism according to claim 2, further comprising a first tongue extending from said box and pivotally connected to said upper link; and a second tongue extending from said sliding link and pivotally connected to said lower link.

11. The retaining mechanism according to claim 3, further comprising a first tongue extending from an upper side of said base link and pivotally connected to said upper link; and a second tongue extending from a lower side of said sliding link and pivotally connected to said lower link.

12. The retaining mechanism according to claim 1, further comprising a disposable liner removably located on said front link.

13. The retaining mechanism according to claim 2, further comprising a disposable liner removably located on said front link.

14. The retaining mechanism according to claim 3, further comprising a disposable liner removably located on said front link.

15. The retaining mechanism according to claim 4, further comprising a disposable liner removably located on said front link.

* * * * *